United States Patent
Mughal et al.

(10) Patent No.: US 9,935,243 B2
(45) Date of Patent: Apr. 3, 2018

(54) MULTISTEP DEPOSITION OF ZINC OXIDE ON GALLIUM NITRIDE

(71) Applicant: The Regents of the University of California, Oakland, CA (US)

(72) Inventors: Asad J. Mughal, Goleta, CA (US); Sang Ho Oh, Goleta, CA (US); Steven P. DenBaars, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/266,990

(22) Filed: Sep. 15, 2016

(65) Prior Publication Data
US 2017/0077356 A1   Mar. 16, 2017

Related U.S. Application Data

(60) Provisional application No. 62/218,920, filed on Sep. 15, 2015.

(51) Int. Cl.
| | |
|---|---|
| *H01L 33/40* | (2010.01) |
| *H01L 33/42* | (2010.01) |
| *H01L 33/32* | (2010.01) |
| *H01L 31/0224* | (2006.01) |

(52) U.S. Cl.
CPC .............. *H01L 33/42* (2013.01); *H01L 33/32* (2013.01); *H01L 31/022483* (2013.01); *H01L 2933/0016* (2013.01)

(58) Field of Classification Search
None
See application file for complete search history.

(56) References Cited

U.S. PATENT DOCUMENTS

| | | | |
|---|---|---|---|
| 5,614,727 A | 3/1997 | Mauri et al. | |
| 7,132,691 B1 * | 11/2006 | Tanabe | B82Y 20/00 257/103 |
| 7,192,802 B2 | 3/2007 | Stecker et al. | |
| 7,829,376 B1 * | 11/2010 | Adekore | H01L 21/02554 438/104 |

(Continued)

OTHER PUBLICATIONS

Kim, J.H., et al., "Growth of Heteroepitaxial ZnO Thin Films on GaN-Buffered Al2O3 (0001) Substrates by Low-Temperature Hydrothermal Synthesis at 90° C.," Adv. Funct. Mater., vol. 17, No. 3, pp. 463-471, Feb. 2007.

(Continued)

*Primary Examiner* — Benjamin Sandvik
(74) *Attorney, Agent, or Firm* — Gates & Cooper LLP

(57) ABSTRACT

A method for fabricating a Zinc Oxide (ZnO) conductive film on a semiconductor material, including depositing a doped ZnO seed layer on a diode, wherein the ZnO seed layer forms an electrical contact to the diode; and depositing a ZnO layer on the ZnO seed layer, wherein the ZnO seed layer and the ZnO layer each have a thickness, a crystal quality, and a doping level such that (1) the diode comprising III-nitride material is turned on with a turn on voltage of 2.75 volts or less applied across the ZnO layers and the diode, and (2) a contact resistance, of a structure comprising the ZnO layers and the diode, is lower as compared to a contact resistance of a structure comprising the ZnO layer directly on the diode without the ZnO seed layer.

22 Claims, 8 Drawing Sheets

(56) References Cited

U.S. PATENT DOCUMENTS

| | | | |
|---|---|---|---|
| 8,536,618 B2 | 9/2013 | Richardson et al. | |
| 2004/0094085 A1* | 5/2004 | White | C23C 14/081 |
| | | | 117/4 |
| 2004/0227150 A1* | 11/2004 | Nakahara | C30B 23/02 |
| | | | 257/103 |
| 2006/0091499 A1* | 5/2006 | Stecker | C30B 25/02 |
| | | | 257/614 |
| 2007/0116986 A1* | 5/2007 | Garg | C23C 16/407 |
| | | | 428/701 |
| 2008/0075857 A1 | 3/2008 | Chen et al. | |
| 2008/0111144 A1 | 5/2008 | Fichtenbaum et al. | |
| 2008/0182358 A1 | 7/2008 | Cowdery-Corvan et al. | |
| 2009/0081842 A1 | 3/2009 | Nelson et al. | |
| 2010/0032008 A1* | 2/2010 | Adekore | B82Y 20/00 |
| | | | 136/255 |
| 2010/0133527 A1* | 6/2010 | Lin | H01L 33/02 |
| | | | 257/43 |
| 2010/0263586 A1 | 10/2010 | Richardson et al. | |
| 2011/0101414 A1 | 5/2011 | Thompson et al. | |
| 2011/0266551 A1 | 11/2011 | Thompson et al. | |
| 2013/0209685 A1 | 8/2013 | Ku et al. | |
| 2014/0083501 A1* | 3/2014 | Cho | H01L 31/02168 |
| | | | 136/256 |
| 2015/0144956 A1* | 5/2015 | Watanabe | H01L 33/32 |
| | | | 257/76 |
| 2015/0287871 A1* | 10/2015 | Manders | H01L 31/032 |
| | | | 257/43 |

OTHER PUBLICATIONS

PCT International Search Report & Written Opinion dated Jan. 24, 2017, International Application No. PCT/US2016/051984.

Janotti, A., et al., 'Fundamentals of zinc oxide as a semiconductor, Reports Prog. Phys., vol. 72, No. 12, p. 126501, 29 pages, Dec. 2009.

Le, H.Q., et al., "Gallium and indium co-doping of epitaxial zinc oxide thin films grown in water at 90° C.," J. Phys. D. Appl. Phys., vol. 44, No. 12, p. 125104, 8 pages, Mar. 2011.

Nakahara, K. et al., "Improved External Efficiency InGaN-Based Light-Emitting Diodes with Transparent Conductive Ga-Doped ZnO as p-Electrodes," Japanese J. Appl. Physics, Part 2 Lett., vol. 43, No. 2A, pp. L180-L182, 2004.

Nicholas, N.J. et al., "The mechanism for hydrothermal growth of zinc oxide," CrystEngComm, vol. 14, No. 4, p. 1232-1240, 2012.

Reading, A.H. et al., "High efficiency white LEDs with single-crystal ZnO current spreading layers deposited by aqueous solution epitaxy", Opt.Express, vol. 20, No. 1, pp. A13-A19, Jan. 2012.

* cited by examiner

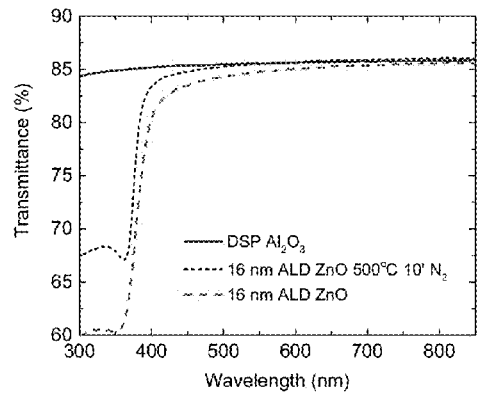
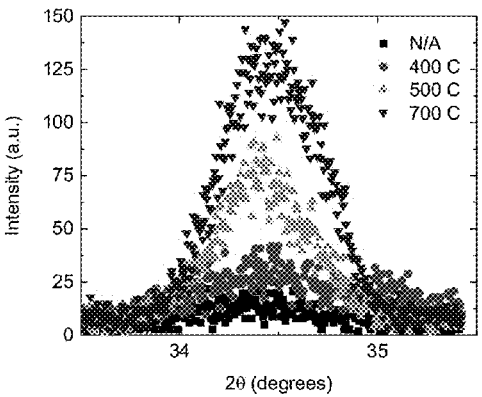
*Figure 3c*
*Figure 3d*

MULTISTEP DEPOSITION OF ZINC OXIDE ON GALLIUM NITRIDE

CROSS REFERENCE TO RELATED APPLICATIONS

This application claims the benefit under 35 U.S.C. Section 119(e) of and commonly-assigned U.S. Provisional Patent Application No. 62/218,920, filed Sep. 15, 2015, by Asad Mughal, Sang Ho Oh, and Steven DenBaars, entitled "MULTISTEP DEPOSITION OF ZINC OXIDE ON GALLIUM NITRIDE," which application is incorporated by reference herein.

BACKGROUND OF THE INVENTION

1. Field of the Invention

The present invention is related to a method of depositing Zinc Oxide (ZnO) using a multistep process, for example on a semiconductor material such as a group III-nitride based optoelectronic device.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

Zinc oxide (ZnO) is a group II-VI direct band gap compound semiconductor material used in a wide array of electronic applications. Given its wide band gap and ease of doping, ZnO films can simultaneously achieve high optical transparency and low electrical resistivity. Transparent electrodes composed of ZnO can be used for optoelectronic devices such as light emitting diodes, laser diodes, photovoltaics, and thin film transistors. In addition to those devices, conductive films containing zinc oxide have been shown applicable in varistors, piezoelectric transducers, as well as gas, chemical and biological sensors. ZnO films can be readily made highly conductive through doping with substitutional atoms such as group three elements (i.e. Al, Ga, and In) [1]. Compared to conductive films such as indium tin oxide (ITO), ZnO can typically be deposited at lower costs using a variety of physical and chemical deposition techniques. ZnO films can also be easily patterned using either wet or dry etching methods. However, using a single deposition method to produce high quality ZnO films for device applications can be challenging.

ZnO on GaN

One application for which conductive ZnO films are especially well suited is as a transparent electrode for III-N based optoelectronics [2]. Given that ZnO and III-N materials share the same wurtzite crystal structure and are closely latticed matched to one another, epitaxial films of ZnO can be deposited on this material system. This allows for the growth of ordered crystalline ZnO films with high carrier mobilities and low optical absorbance, due to the reduction of phonon/electron scattering centers such as grain boundaries, point defects, and lattice distortions. In addition, the ZnO high refractive index of ~2 allows for more efficient light extraction from III-N light emitters such as GaN, whose refractive index is ~2.5, by increasing the critical angle for total internal reflection. Moreover, ZnO's ease of patternability, whether through selective area growth, patterned etching, or roughening etches, further increases light extraction by reducing the probability of photons meeting the criteria for total internal reflection.

SUMMARY OF THE INVENTION

To overcome the limitations described above, and to overcome other limitations that will become apparent upon reading and understanding this specification, one or more embodiments of the present invention describe a method of depositing ZnO on III-nitride materials using a multi-step approach involving the deposition of thin seed layer followed by the deposition of a thicker bulk layer.

One or more embodiments of the present invention disclose an optoelectronic device, comprising: a doped seed layer (comprising Zinc and Oxygen) on a diode, wherein the seed layer forms an electrical contact to the diode; and a layer (comprising Zinc and Oxygen, e.g., a bulk layer) on the seed layer, wherein the seed layer and the layer each have a thickness, a crystal quality, and a doping level such that:

the diode comprising III-nitride material is turned on with a turn on voltage of 2.75 volts or less applied across the ZnO layers and the diode (or, e.g., applied across a structure comprising the seed layer, the bulk layer, and the diode); and/or a contact resistance of a metal contact to the layer (e.g., the bulk layer) is lower as compared to a contact resistance of the metal contact to the layer (e.g., the bulk layer) directly on the diode without the seed layer; and/or light having a wavelength of 450 nanometers is transmitted through the seed layer and the layer (e.g., the bulk layer) with a transmittance of at least 80%; and/or the device has a forward voltage of less than 3.5 volts at the current density of 100 amps per centimeter square ($A/cm^2$).

In one or more embodiments, the diode further comprises a III-nitride active layer between an n-type GaN (or III-nitride layer) and a p-type GaN (or III-nitride layer); and the forward voltage and the turn on voltage are applied across the metal contact to the layer (e.g., the bulk layer) and a second metal contact to the n-type GaN or III-nitride layer.

In one or more embodiments, the seed layer is a contact to the p-type or n-type GaN (or III-nitride) layer and the bulk layer is a current spreader.

One or more embodiments of the present invention further disclose a method of fabricating of fabricating a conductive film on a semiconductor material, comprising depositing a seed layer, comprising Zinc and Oxygen on a semiconductor material using a first deposition technique; and depositing a bulk layer on the seed layer, wherein the bulk layer is deposited on the seed layer using a second deposition technique different from the first deposition technique and the bulk layer comprises Zinc and Oxygen. The optoelectronic device embodiments described above can also be fabricated using this method and the embodiments described below.

In one embodiment, the seed layer is deposited via atomic layer deposition (ALD) and the bulk layer is deposited using hydrothermal deposition.

In another embodiment, the seed layer is deposited using electron beam deposition and the bulk layer is deposited using hydrothermal deposition.

In yet another embodiment, the seed layer is deposited using reactive electron beam deposition and the bulk layer is deposited using hydrothermal deposition.

In a further embodiment, the seed layer is deposited using thermal evaporation and the bulk layer is deposited using hydrothermal deposition.

In yet another embodiment, the seed layer is deposited using reactive thermal evaporation and the bulk layer is deposited using hydrothermal deposition.

In a further embodiment, seed layer is deposited using Metal Organic Chemical Vapor Deposition (MOCVD) and the bulk layer is deposited using hydrothermal deposition.

In another embodiment, the seed layer is deposited using Molecular Beam Epitaxy (MBE) and the bulk layer is deposited using hydrothermal deposition.

In yet another embodiment, the seed layer is deposited using hydrothermal deposition and the bulk layer is deposited using hydrothermal deposition.

In another embodiment, the seed layer is deposited via ALD and the bulk layer is deposited using sputter deposition.

In a further embodiment, the seed layer is deposited using electron beam deposition and the bulk layer is deposited using sputter deposition.

In yet a further embodiment, the seed layer is deposited using reactive electron beam deposition and the bulk layer is deposited using sputter deposition.

In another embodiment, the seed layer is deposited using thermal evaporation and the bulk layer is deposited using sputter deposition.

In yet another embodiment, the seed layer is deposited using reactive thermal evaporation and the bulk layer is deposited using sputter deposition.

In a further embodiment, the seed layer is deposited using MOCVD and the bulk layer is deposited using sputter deposition.

In yet another embodiment, the seed layer is deposited using MBE and the bulk layer is deposited using sputter deposition.

In one or more embodiments using the deposition techniques in any of the preceding embodiments, the seed layer is deposited at a lower temperature than the subsequently deposited layer.

In one or more embodiments using the deposition techniques in any of the preceding embodiments, the method further comprises annealing the (e.g., ZnO) seed layer (e.g., at a temperature between 100 to 800° C.) prior to depositing the (e.g., ZnO) bulk layer.

In one or more ALD embodiments, the ALD method uses a Zn precursor comprising diethyl zinc (DEZ), dimethyl zinc, or zinc acetate, an oxidant comprising water, oxygen plasma, or ozone gas, and a substrate temperature between 50 to 500° C.

In one or more embodiments of any of the preceding embodiments, the doped seed layer is ZnO or an alloy containing ZnO and the layer on the seed layer is ZnO or an alloy containing ZnO.

BRIEF DESCRIPTION OF THE DRAWINGS

Referring now to the drawings in which like reference numbers represent corresponding parts throughout:

FIG. 4a, FIG. 4b, and FIG. 4c plot Hall Effect measurement results of Un-intentionally Doped (UID) and doped hydrothermal ZnO films (doped with dopants gallium (Ga), aluminum (al), or indium (In)), wherein FIG. 4a shows carrier concentration vs dopant concentration in millimolar (mM), FIG. 4b shows mobility vs dopant concentration in mM, and FIG. 4c shows resistivity vs dopant concentration in mM.

DETAILED DESCRIPTION OF THE INVENTION

Figure 1:
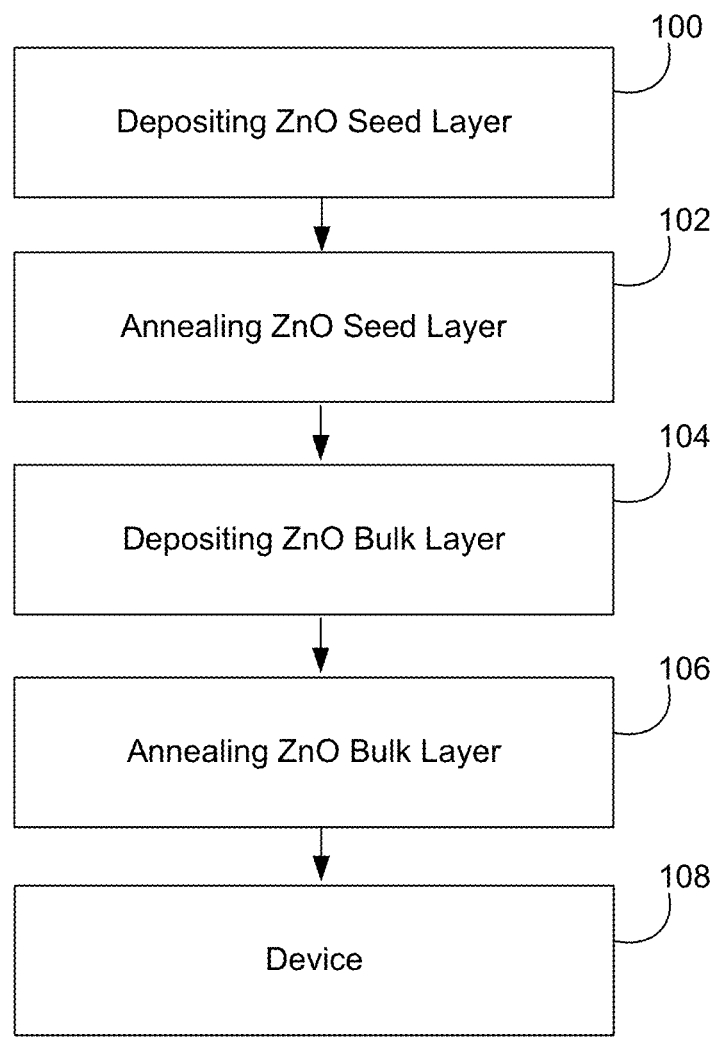
FIG. 1 is a flowchart illustrating a process flow for two-step ZnO deposition.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

ZnO Deposition

Poor crystalline quality in conductive oxides can cause a reduction in carrier mobility as a result of increased point defects, grain boundaries, and lattice distortions. Therefore, it is desirable to deposit epitaxial films with a single crystallographic orientation and low degree of mosaicity. In order to achieve this, substrates need to be selected such that they allow for heteroepitaxial growth. These substrates must be composed of a material that contains crystallographic orientations with lattice parameters which can accommodate the growth of ZnO with minimal tensile or compressive stress. For ZnO, suitable substrates for epitaxial growth include materials such as crystalline Al$_2$O$_3$, GaN, AlN, SiO$_2$, SiC, GaAs, and MgAl$_2$O$_4$. Once a suitable substrate is selected, the next step is to select an appropriate deposition technique. In the case of ZnO there exist several possible methods, which can be categorized into either physical or chemical deposition techniques. Physical deposition techniques are typically carried out in a partial or high vacuum environment and entail bombarding a substrate with sources composed of either ZnO or zinc in the presence of oxygen. For ZnO, these methods include molecular beam epitaxy (MBE), ion beam deposition (IBD), pulsed laser deposition (PLD), RF/magnetron sputtering, electron beam deposition (e-beam), and thermal evaporation. Chemical deposition techniques rely of reactions on the surface of the substrate to form the film using gaseous or solution based precursors. Techniques in this category include metal-organic chemical vapor deposition (MOCVD), atomic layer deposition (ALD) [7,8], spray pyrolysis, electrodeposition, sol-gel deposition, and hydrothermal deposition [11-13]. Due to reaction kinetics and thermodynamics, each deposition method can yield films of varying quality and growth rate. Furthermore, techniques such as sputtering and ion beam deposition introduce high energy ions into the substrate, resulting in poor quality electrical contacts. Selecting an appropriate deposition method for ZnO would depend on several factors such as desired properties and costs. Although high vacuum techniques such as MBE can yield high quality films, depositing under those conditions can be costly. However, films deposited using less costly approaches such as spray pyrolysis can result in poor quality ZnO films.

One solution to these problems is to combine two or more deposition techniques in order to achieve the desired result of a low cost high quality conductive ZnO film. This multistep approach would allow one to leverage the advantages of the various deposition techniques in order to achieve specific film properties. For example, when deposited on p-type GaN as a transparent contact layer in a III-N device such as a Light Emitting Diode (LED), the first deposition can use a technique that allows for a thin layer of epitaxial ZnO with high doping density which functions both as a contact layer to the p-type GaN and as a seed layer for a thicker bulk layer of ZnO deposited using another technique. The seed layer would dictate the structure of subsequent layers by functioning as a template, allowing for a heteroepitaxial relationship to the underlying substrate.

Thus, one or more embodiments of the present invention describe a method for depositing a conductive film which is comprised of Zinc Oxide as the main component, using a multistep approach leveraging at least two different deposition techniques. The preferred embodiment involves epitaxial growth of a ZnO seed layer by ALD on a III-N device followed by the growth of a bulk layer through hydrothermal deposition.

FIG. 1 exhibits a flow chart of the proposed deposition scheme, comprising the following steps.

Block 100 represents depositing a seed layer comprising Zinc and Oxygen. In one or more embodiments, the seed layer comprises, is, or consists essentially of ZnO, a ZnO alloy, or an alloy containing/comprising ZnO, such as, but not limited to, Indium Zinc Oxide.

In one or more embodiments, the seed layer (e.g., ZnO seed layer) is deposited on a semiconducting material comprising a III-nitride active layer deposited between an n-type GaN (or III-nitride) layer and a p-type GaN (or III-nitride) layer, wherein the (e.g., ZnO) seed layer is deposited on the p-type GaN (or III-nitride) layer.

Block 102 represents annealing the seed layer.

Block 104 represents depositing a bulk layer comprising Zinc and Oxygen. In one or more embodiments, the layer (e.g., bulk layer) on the seed layer comprises, is, or consists essentially of ZnO, a ZnO alloy, or an alloy containing/comprising ZnO (e.g., Indium Zinc Oxide).

In one or more embodiments, the (e.g., ZnO) bulk layer is a p-type (e.g., ZnO) bulk layer and the (e.g., ZnO) seed layer is a p-type (e.g., ZnO) seed layer.

Block 106 represents and annealing the bulk layer.

Block 108 represents the end result, a device or device structure.

In one or more embodiments, the device is an optoelectronic device wherein the seed layer comprising Zinc and Oxygen and the layer (e.g., bulk layer comprising Zinc and Oxygen) each have a thickness, crystal quality, and doping level, and are annealed such that (1) light having a wavelength of 450 nanometers (nm) is transmitted through the (e.g., ZnO) seed layer and the layer (e.g., ZnO bulk layer) with a transmittance of at least 80% and (2) the device has a turn on voltage of less than 2.75 volts and a forward voltage of less than 3.5 volts (at a current density of 100 amps per centimeter square) when the forward voltage and turn on voltages are applied across the metal contact to the ZnO (or bulk layer) and a metal contact to the n-type layer. The crystal quality can be characterized by a full width at half maximum (FWHM) measured by X-ray diffraction, wherein the FWHM is in a range having a maximum value of 1.75 degrees. Thus, the range of doping levels, dopant types, FWHM, thicknesses, and/or annealing temperatures for the ZnO (or alloy containing ZnO) can be such that the desired transmittance and electrical properties (e.g., turn on voltage, forward voltage, current density, contact resistance, current spreading performance, and/or mobility (e.g., at least 40 cm$^2$/Vs)), etc. are achieved.

Figure 2:
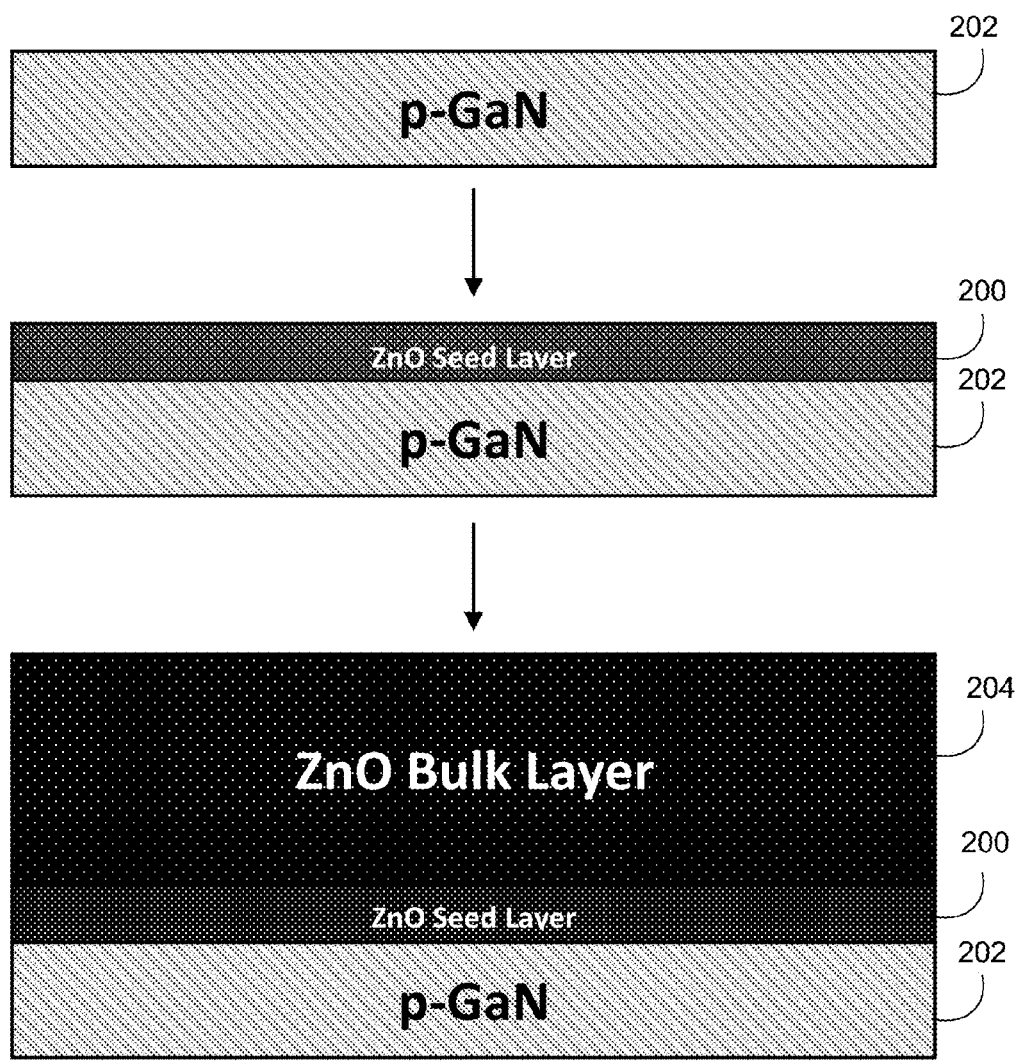
FIG. 2 is a schematic of two-step ZnO deposition.

FIG. 2 illustrates the steps involved to form a ZnO structure on GaN, comprising depositing the ZnO seed layer 200 on p-type GaN 202, and depositing the ZnO bulk layer 204 on the ZnO seed layer 200.

Example: ALD Deposition

Figure 3A:
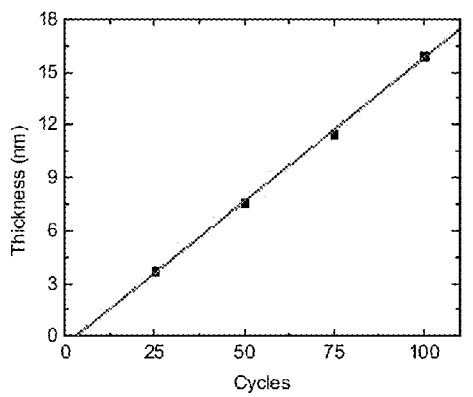
FIG. 3a plots measurement results for growth rate of ALD ZnO films deposited using DEZ and H$_2$O at 200° C., FIG. 3b plots measured optical transmission spectra of ALD films of varying thickness deposited directly on sapphire, FIG. 3c plots measured transmission for a 16 nm thick ALD ZnO film (deposited on sapphire) before and after annealing at 500° C.
Figure 3B:
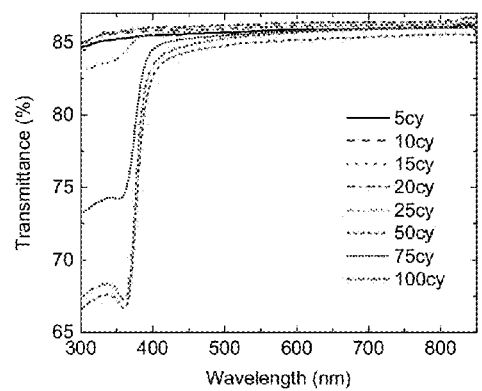
FIG. 3d is a measured X-Ray Diffraction (XRD) plot of ALD films under varying annealing conditions.

ALD is a variant of MOCVD in which film growth occurs through a series of self-limiting reactions which form monolayer thick sheets of the intended material. These self-limiting cycles are achieved by pulsing precursor, oxidant, and inert gases in alternating intervals into the reaction chamber containing the substrate. Film thickness is controlled by adjusting the number of cycles (cy) as shown in FIG. 3a. The thickness achieved influences the optical properties of the deposited ZnO film, as shown in FIG. 3b. ALD ZnO is carried out using Zn precursors such as diethyl zinc (DEZ), dimethyl zinc, or zinc acetate and an oxidant such as water, oxygen plasma, or ozone gas. The chemical reaction for ALD deposition using diethyl zinc and water is as follows:

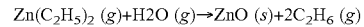

$$Zn(C_2H_5)_2\ (g)+H2O\ (g)\rightarrow ZnO\ (s)+2C_2H_6\ (g)$$

Dopants can also be introduced to the film to improve electrical properties, through the addition of precursors containing group III elements such as Al, Ga, and/or In. Substrate temperatures are controlled in order to achieve desired deposition rates and crystal quality. For ZnO ALD, substrate temperatures can vary between 50 to 500° C. In the preferred embodiment, ALD ZnO is deposited on p-type GaN using diethyl zinc and water at a substrate temperature of 300° C. for 25 cycles, yielding a film approximately 3 nm thick. This seed layer can be annealed in order to improve its properties, such as transmittance contact resistance, and crystallinity, see FIG. 3c and FIG. 3d. Annealing temperatures can range between 100 to 800° C., with the preferred embodiment being 700° C.

Example: Hydrothermal Deposition

Hydrothermal deposition is an aqueous solution based approach to growing ZnO. It utilizes the fact that Zn ions in solution exhibit retrograde solubility with increasing temperature and pH [3]. This allows Zn ions to achieve supersaturated conditions at elevated temperatures and pH levels and form ZnO. The zinc precursor is provided by Zn containing salts such as zinc nitrate ($Zn(NO_3)_2$) or zinc chloride (ZnCl). The pH (i.e. $OH^-$ concentration) of the solution is controlled by the addition of a base such as ammonium hydroxide ($NH_4OH$) or sodium hydroxide (NaOH). Zn ions in solution react with hydroxide ions to form an intermediary ZnOH phase which is then converted into ZnO through a dehydration reaction[4]. The chemical reactions involved in the hydrothermal deposition of ZnO are:

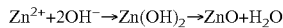

Figure 4A:
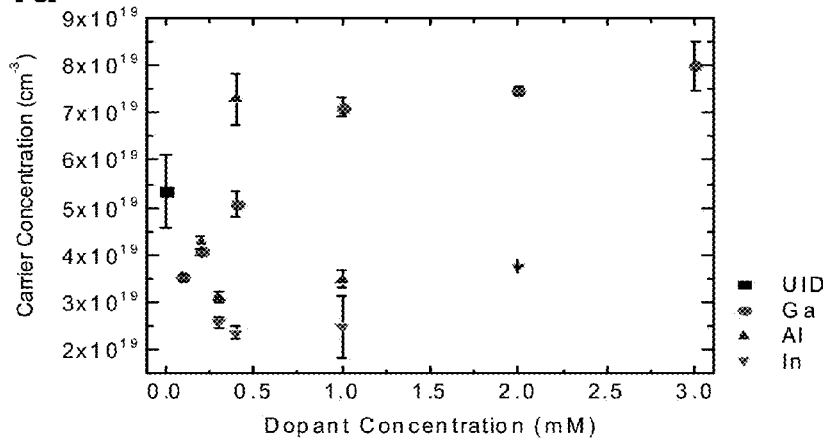
Figure 4B:
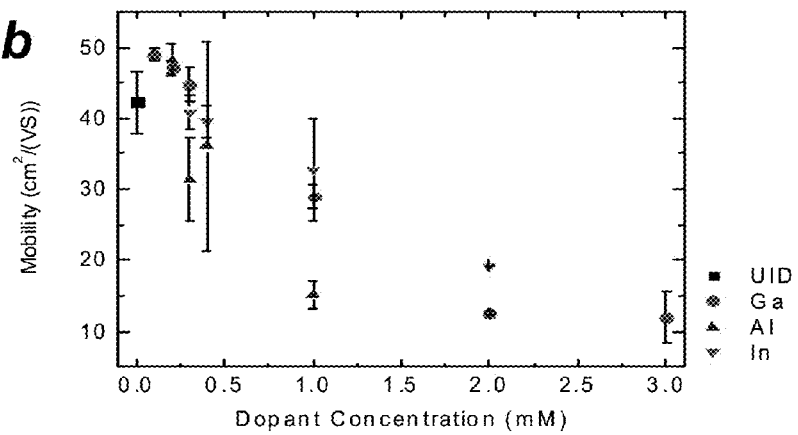
Figure 4C:
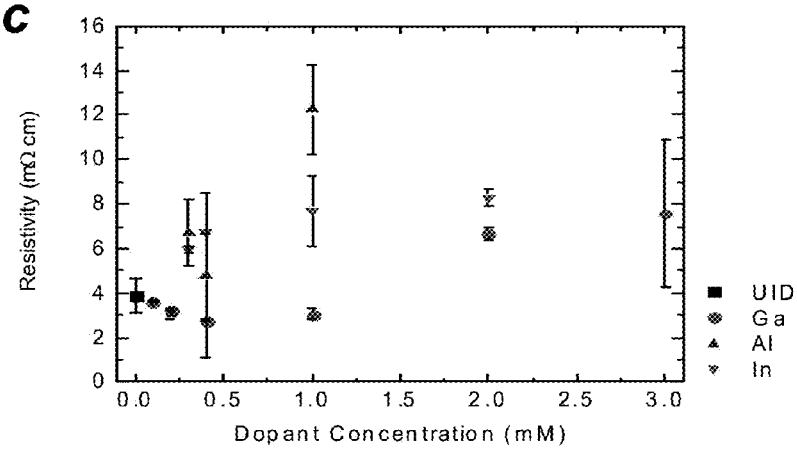

Additional salts can be added in order to control the growth of the films. A common such additive is trisodium citrate ($Na_3C_6H_5O_7$), which retards the growth of the c-plane (0001) of ZnO in order to achieve a continuous film. Dopants can readily be added to this solution by the introduction of alternative metal salts such as aluminum nitrate ($Al(NO_3)_3$), gallium nitrate ($Ga(NO_3)_3$), or Indium nitrate ($In(NO_3)_3$) [5]. Carrier concentrations and mobilities of this layer can be adjusted through the addition of these types of dopants, as shown in FIGS. 4a-4c. In the preferred embodiment, the hydrothermal reactions occur at 90° C. with an aqueous solution composed of 25 mMolar Zn nitrate, 5 mMolar trisodium citrate, and 0.4 mMolar Ga nitrate with 29 wt % ammonium hydroxide added to achieve a pH of 10.5.

Figure 5:
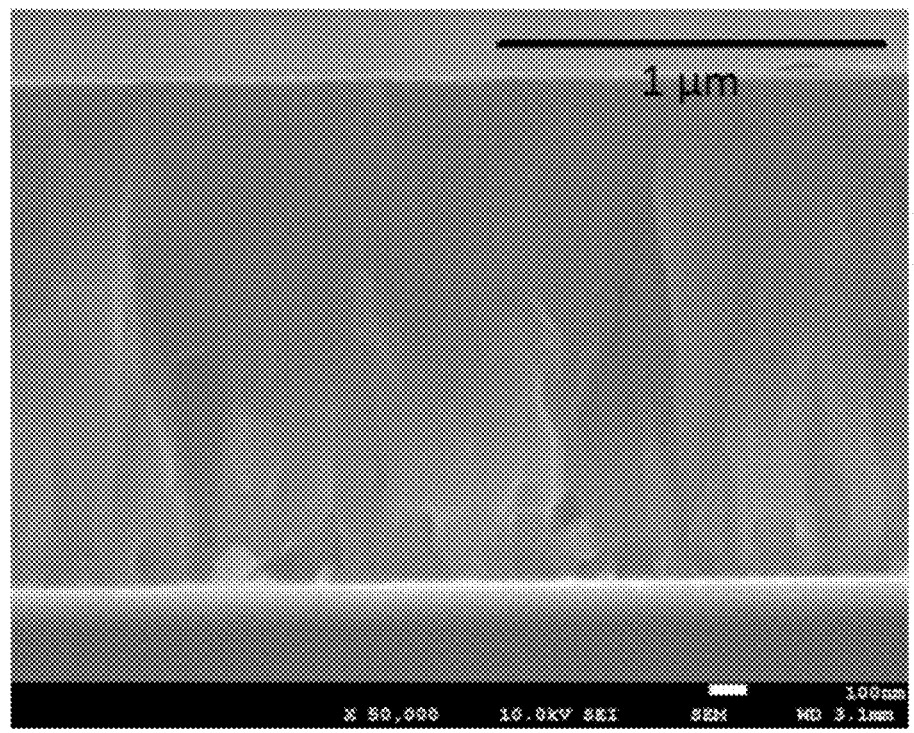
FIG. 5 is a Scanning Electron Microscope (SEM) micrograph of ALD-hydrothermal ZnO deposited on GaN.

FIG. 5 displays a typical SEM micrograph of a hydrothermally deposited ZnO film grown on an ALD seed layer.

Figure 6:
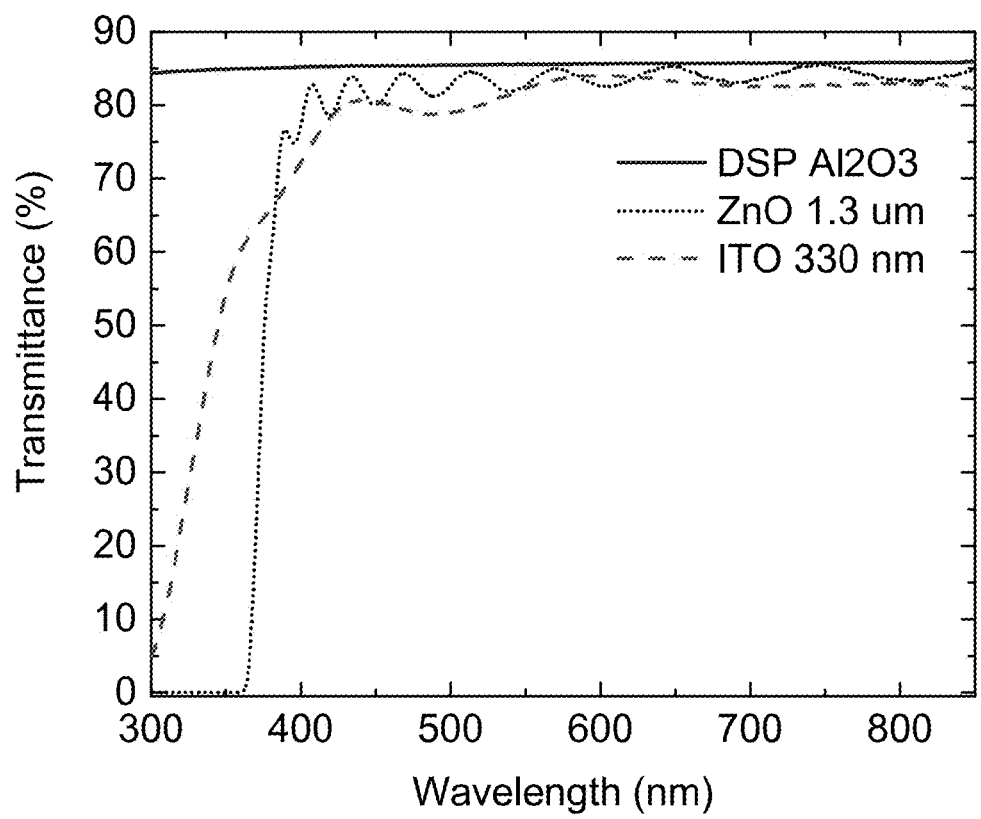
FIG. 6 shows optical transmission spectra comparing Indium Tin Oxide (ITO) and as deposited undoped ZnO deposited on double side polished sapphire (DSP).

Since ZnO has a low absorption coefficient, it can be deposited at greater thicknesses than transparent electrodes with higher coefficients, such as ITO. In FIG. 6, optical transmission spectra show that ZnO films with thickness more than four times that of ITO can transmit light at similar levels.

Example Structure

Figure 7:
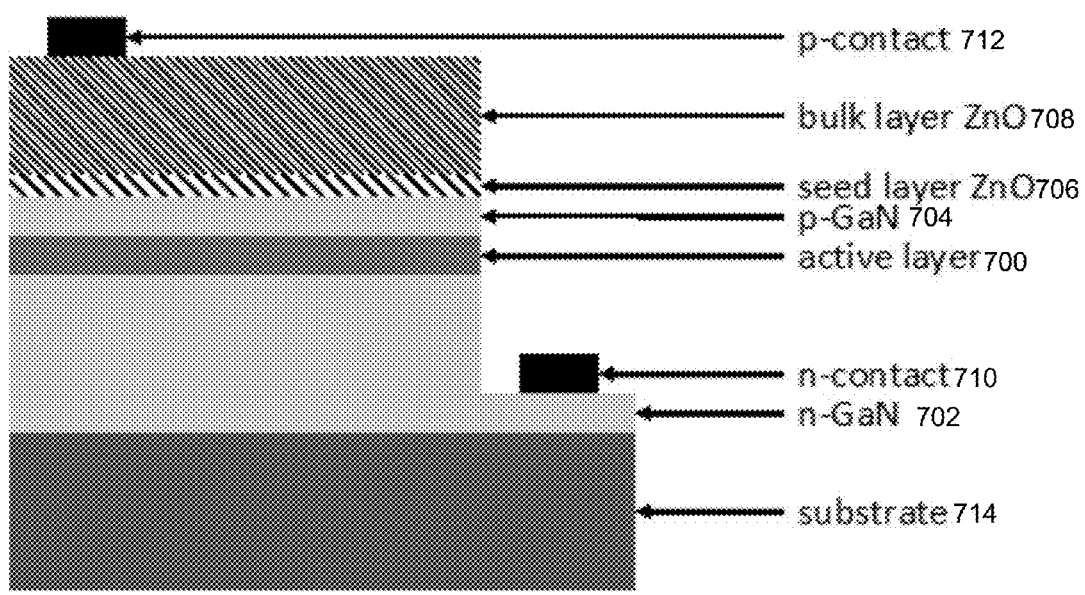
FIG. 7 is a cross-sectional schematic of a device design, wherein a lateral LED is fabricated on an Al$_2$O$_3$ substrate, and wherein the transparent electrode layer is composed of a ZnO film deposited in two steps.
Figure 8:
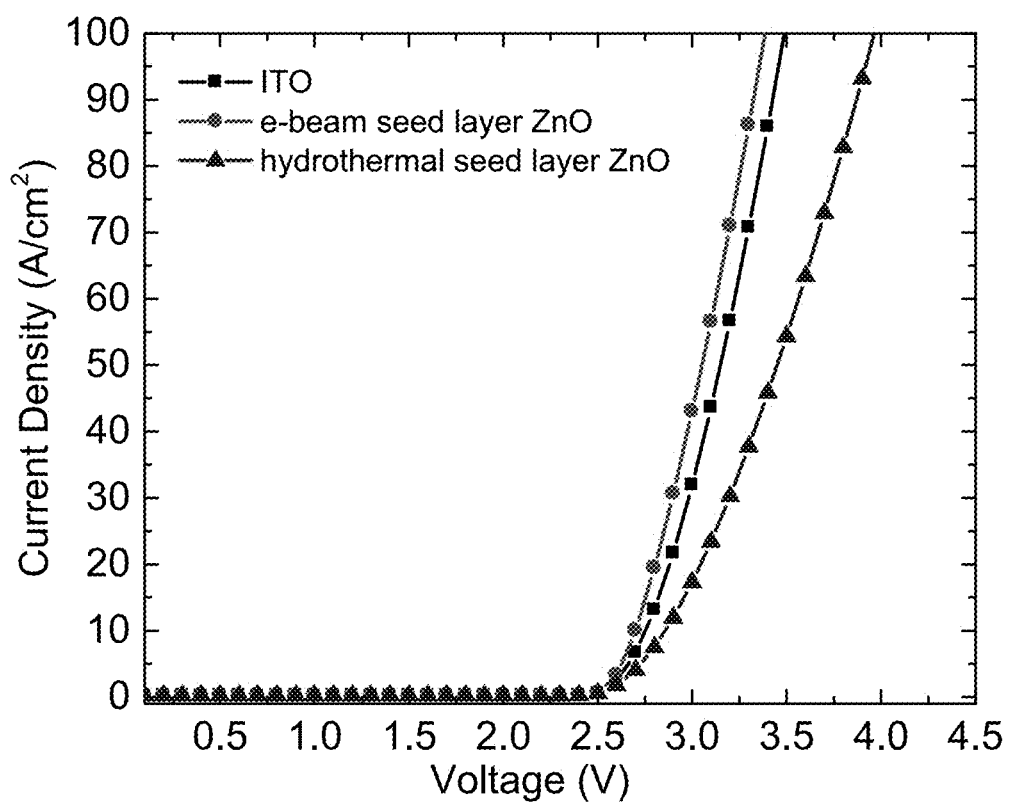
FIG. 8 plots on wafer LED current vs. voltage (IV) comparing transparent electrodes composed of Indium Tin Oxide (ITO), Ga doped ZnO with a hydrothermally deposited seed layer, and an electron beam deposited seed layer.

FIG. 7 shows a schematic cross section of the device that is characterized in FIG. 8, comprising an active layer 700 (e.g., III-nitride active layer) between an n-type GaN (or III-Nitride) layer 702 (n-GaN) and a p-type GaN (or In-nitride) layer 704 (p-GaN); a p-type ZnO seed layer 706 on the p-type GaN layer 704; a p-type ZnO bulk layer 708 on the p-type ZnO seed layer 706; a first metal contact (n-contact 710) to the n-type GaN layer 702; and a second metal contact (p-contact 712) to the p-type ZnO bulk layer 708. Also shown is the substrate 714 on which the n-type GaN layer 702 is grown. Examples of substrates include, but are not limited to, a polar, nonpolar, or semipolar III-nitride (e.g., GaN) substrate, or a foreign substrate (e.g., sapphire).

FIG. 8 demonstrates on wafer LED IV characteristics of a two-step deposition of ZnO in which the seed layer is deposited using e-beam deposition and an additional ZnO (bulk) layer is grown hydrothermally on the ZnO seed layer. The data shows improved turn on and forward voltages compared to ITO and films with a hydrothermally deposited seed layer. For example, FIG. 8 shows the device has a forward voltage of less than 3.5 volts at a current density of 100 Amps per centimeter square when the forward voltage is applied across the metal contact 712 to the ZnO layer and the metal contact 710 to the n-type layer, and a turn on voltage of less than 2.75 volts is needed to achieve a forward current density of at least 2.5 A/cm². For the data in FIG. 8, Cr/Ni/Au 25/20/500 nm was used to make contact with both the ZnO and ITO, and Ti/Al/Ni/Au (20/100/100/100 nm) was used to make contact to the n-GaN. However, other compositions of metal contacts could be used.

Moreover, the device comprising the ZnO layer and the ZnO seed layer has a lower turn on voltage and a lower forward voltage (for a given current density) as compared to the device comprising the ZnO layer without the ZnO seed layer.

Thus, the inventors have surprisingly and unexpectedly found that depositing a ZnO seed layer on a semiconductor p-n junction diode structure using a first deposition technique (other than hydrothermal deposition, e.g., electron beam deposition) and depositing a ZnO layer on the ZnO seed layer using a second deposition technique (different than the first deposition technique, e.g., hydrothermal deposition) significantly reduces turn on voltage, forward voltage, and on resistance of the diode structure, when the ZnO seed layer is used as an electrical contact (e.g., p-contact layer) to the p-n junction diode (e.g., to the p-type GaN layer of the p-n junction diode) and the ZnO layer is used as a current spreading layer. More specifically, the inventors' data (FIG. 8) surprisingly and unexpectedly shows that turn on voltage is reduced by at least 9% and forward voltage at a current density of 100 A/cm² is reduced by more than 12.5%, as compared to when the same diode is contacted with the same thicknesses of ZnO seed and ZnO layer (but where the ZnO seed and ZnO layer are both hydrothermally grown). As a result, devices fabricated using the ZnO layers as current spreading and contact layers have significantly increased efficiency (e.g., more optical/light output power for a given electrical input power).

Possible Modifications and Variations

One or more embodiments of the present invention disclose a method for fabricating a conductive film on a semiconductor material, wherein ZnO (or an alloy containing ZnO) is the main component of the conductive film and the ZnO (or the alloy containing ZnO) comprises a seed layer on which an additional layer is subsequently deposited.

In various embodiments of the present invention, the seed layer (e.g., comprising Zinc and Oxygen, ZnO, or alloy containing ZnO) and the additional layer (e.g., bulk layer comprising Zinc and Oxygen, ZnO, or alloy containing ZnO) are deposited using a variety of different techniques and/or different conditions:

In one embodiment, the seed layer is deposited via ALD and the bulk layer is deposited using hydrothermal deposition.

In another embodiment, the seed layer is deposited using electron beam deposition and the bulk layer is deposited using hydrothermal deposition.

In one embodiment, the seed layer is deposited via electron cyclotron resonance (ECR) plasma deposition and the bulk layer is deposited using hydrothermal deposition.

In yet another embodiment, the seed layer is deposited using reactive electron beam deposition and the bulk layer is deposited using hydrothermal deposition.

In a further embodiment, the seed layer is deposited using thermal evaporation and the bulk layer is deposited using hydrothermal deposition.

In yet another embodiment, the seed layer is deposited using reactive thermal evaporation and the bulk layer is deposited using hydrothermal deposition.

In a further embodiment, seed layer is deposited using MOCVD and the bulk layer is deposited using hydrothermal deposition.

In another embodiment, the seed layer is deposited using MBE and the bulk layer is deposited using hydrothermal deposition.

In yet another embodiment, the seed layer is deposited using hydrothermal deposition and the bulk layer is deposited using hydrothermal deposition.

In yet another embodiment, the seed layer and/or the bulk layer are deposited using electron cyclotron resonance (ECR) plasma deposition.

In another embodiment, the seed layer is deposited via ALD and the bulk layer is deposited using sputter deposition.

In a further embodiment, the seed layer is deposited using electron beam deposition and the bulk layer is deposited using sputter deposition.

In yet a further embodiment, the seed layer is deposited using reactive electron beam deposition and the bulk layer is deposited using sputter deposition.

In another embodiment, the seed layer is deposited using thermal evaporation and the bulk layer is deposited using sputter deposition.

In yet another embodiment, the seed layer is deposited using reactive thermal evaporation and the bulk layer is deposited using sputter deposition.

In a further embodiment, the seed layer is deposited using MOCVD and the bulk layer is deposited using sputter deposition.

In yet another embodiment, the seed layer is deposited using MBE and the bulk layer is deposited using sputter deposition.

In one or more embodiments using the deposition techniques in any of the preceding embodiments, the seed layer is deposited at a lower temperature than the subsequently deposited layer.

In one or more embodiments, the ZnO seed layer is deposited using a first deposition technique and the ZnO layer is deposited using a second deposition technique different from the first deposition technique.

The semiconductor material on which the ZnO (or alloy containing ZnO) is deposited includes, but is not limited to GaN, p-type GaN, or n-type GaN.

A variety of devices can be fabricated using the method. In one or more embodiments, a III-N based optoelectronic device (e.g., LED, laser diode (LD), or solar cell), comprised of epitaxially grown layers and ZnO layers is fabricated, wherein the ZnO layers (seed and additional layer) are deposited on the epitaxially grown layers using the above described approach).

In one or more embodiments, the (e.g., ZnO) seed layer acts as a contact layer (e.g., p-contact or n-contact) and the (e.g., ZnO) bulk layer acts as a current spreader (e.g., such that the device can be operated at (e.g., emit electromagnetic radiation at) current densities greater than 100 A/cm$^2$).

Advantages and Improvements

One or more of the methods of depositing ZnO described herein can yield high quality films and be employed on a commercial scale. One or more of the methods described herein would allow ZnO to compete with materials such as indium tin oxide (ITO) as a transparent conducting oxide for optoelectronic applications such as III-nitride light emitters and photovoltaics.

Nomenclature

GaN and its ternary and quaternary compounds incorporating aluminum and indium (AlGaN, InGaN, AlInGaN) are commonly referred to using the terms (Al,Ga,In)N, III-nitride, III-N, Group III-nitride, nitride, $Al_{1-x-y}In_yGa_xN$ where $0<x<1$ and $0<y<1$, or AlInGaN, as used herein. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga,In)N materials within the scope of the invention may further include minor quantities of dopants and/or other impurity or inclusional materials. Boron (B) may also be included.

One approach to eliminating the spontaneous and piezoelectric polarization effects in GaN or III-nitride based optoelectronic devices is to grow the III-nitride devices on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al,In,B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero l Miller index. Some commonly observed examples of semi-polar planes include the (11-22), (10-11), and (10-13) planes. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

Polar c-plane devices can also be fabricated. The Gallium or Ga face of GaN is the c$^+$ or (0001) plane, and the Nitrogen or N-face of GaN or a III-nitride layer is the c$^-$ or (000-1) plane.

REFERENCES

The following references are incorporated by reference herein.

[1] A. Janotti and C. G. Van de Walle, "Fundamentals of zinc oxide as a semiconductor," *Reports Prog. Phys.*, vol. 72, no. 12, p. 126501, December 2009.

[2] A. H. Reading, J. Richardson, C.-C. Pan, S. Nakamura, and S. P. DenBaars, "High efficiency white LEDs with single-crystal ZnO current spreading layers deposited by aqueous solution epitaxy.," *Opt. Express*, vol. 20, no. 1, pp. A13-9, January 2012.

[3] J. H. Kim, E.-M. Kim, D. Andeen, D. Thomson, S. P. DenBaars, and F. F. Lange, "Growth of Heteroepitaxial ZnO Thin Films on GaN-Buffered Al$_2$O$_3$ (0001) Substrates by Low-Temperature Hydrothermal Synthesis at 90° C.," *Adv. Funct. Mater.*, vol. 17, no. 3, pp. 463-471, February 2007.

[4] N. J. Nicholas, G. V. Franks, and W. a. Ducker, "The mechanism for hydrothermal growth of zinc oxide," *CrystEngComm*, vol. 14, no. 4, p. 1232, 2012.

[5] H. Q. Le and S. J. Chua, "Gallium and indium co-doping of epitaxial zinc oxide thin films grown in water at 90° C.," *J. Phys. D. Appl. Phys.*, vol. 44, no. 12, p. 125104, March 2011.

[6] K. Nakahara, K. Tamura, M. Sakai, D. Nakagawa, N. Ito, M. Sonobe, H. Takasu, H. Tampo, P. Fons, K. Matsubara, K. Iwata, A. Yamada, and S. Niki, "Improved External Efficiency InGaN-Based Light-Emitting Diodes with Transparent Conductive Ga-Doped ZnO as p-Electrodes," Japanese *J. Appl. Physics, Part 2 Lett.*, vol. 43, no. 2 A, pp. 8-11, 2004.

[7] P. J. Cowdery-corvan, D. H. Levy, D. C. Freeman, and T. D. Pawlik, "PROCESS FOR ATOMIC LAYER DEPOSITION," US 20080182358A1, 2008.

[8] S. F. Nelson, D. H. Levy, L. M. Irving, P. J. Cowdery-Corvan, D. C. Freeman, and C. Ellinger, "PROCESS FOR ATOMIC LAYER DEPOSITION," US 20090081842A1, 2009.

[9] L. Stecker and C. John, "ALD ZnO SEED LAYER FOR DEPOSITION OF ZnO NANOSTRUCTURES ON A SILICON SUBSTRATE," US007192802B2 (12), 2007.

[10] C.-S. Ku and H.-Y. Lee, "DOPING METHOD OF ATOMIC LAYER DEPOSITION," US 20130209685A1, 2013.

[11] J. J. Richardson, F. F. Lange, and M. E. Lange, "LOW TEMPERATURE CONTINUOUS CIRCULATION REACTOR FOR THE AQUEOUS SYNTHESIS OF ZnO FILMS, CTURES' AND BULK SINGLE," US 20100263586A1, 2010.

[12] D. B. Thompson, J. J. Richardson, I. Koslow, F. F. Lange, S. P. DenBaars, S. Nakamura, M. Lange, S. P. DenBaars, and S. Nakamura, "HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION," US 20110266551A1, 2011.

[13] J. J. Richardson, D. B. Thompson, I. Koslow, F. F. Lange, M. Lange, S. P. DenBaars, and Nakamu, "LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS," US008536618B2, 2013.

[14] M.-J. Chen, W.-C. Hsu, and Y.-L. Ho, "METHOD OF FABRICATING BUFFER LAYER ON SUBSTRATE," US 20080075857A1, 2008.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating of fabricating a conductive film on a semiconductor material, comprising:
   depositing a p-type seed layer directly on a p-type semiconductor III-nitride material using a first deposition technique, wherein the seed layer comprises Zinc and Oxygen; and
   depositing a p-type layer, comprising Zinc and Oxygen, on the seed layer, wherein the layer is deposited on the seed layer using a second deposition technique different from the first deposition technique.

2. The method of claim 1, wherein the seed layer is deposited via atomic layer deposition (ALD) and the layer comprising a bulk layer is deposited using hydrothermal deposition.

3. The method of claim 1, wherein the seed layer is deposited using electron beam deposition and the layer comprising a bulk layer is deposited using hydrothermal deposition.

4. The method of claim 1, wherein the seed layer is deposited using reactive electron beam deposition and the layer comprising a bulk layer is deposited using hydrothermal deposition.

5. The method of claim 1, wherein the seed layer is deposited using thermal evaporation and the layer comprising a bulk layer is deposited using hydrothermal deposition.

6. The method of claim 1, wherein the seed layer is deposited using reactive thermal evaporation and the layer comprising a bulk layer is deposited using hydrothermal deposition.

7. The method of claim 1, wherein the seed layer is deposited using Metal Organic Chemical Vapor Deposition (MOCVD) and the layer comprising a bulk layer is deposited using hydrothermal deposition.

8. The method of claim 1, wherein the seed layer is deposited using Molecular Beam Epitaxy (MBE) and the layer comprising a bulk layer is deposited using hydrothermal deposition.

9. The method of claim 1, wherein the seed layer is deposited via Atomic Layer Deposition (ALD) and the layer comprising a bulk layer is deposited using sputter deposition.

10. The method of claim 1, wherein the seed layer is deposited using electron beam deposition and the layer comprising a bulk layer is deposited using sputter deposition.

11. The method of claim 1, wherein the seed layer is deposited using reactive electron beam deposition and the layer comprising a bulk layer is deposited using sputter deposition.

12. The method of claim 1, wherein the seed layer is deposited using thermal evaporation and the layer comprising a bulk layer is deposited using sputter deposition.

13. The method of claim 1, wherein the seed layer is deposited using reactive thermal evaporation and the layer comprising a bulk layer is deposited using sputter deposition.

14. The method of claim 1, wherein the seed layer is deposited using Metal Organic Chemical Vapor Deposition (MOCVD) and the layer comprising a bulk layer is deposited using sputter deposition.

15. The method of claim 1, wherein the seed layer is deposited using Molecular Beam Epitaxy (MBE) and the layer comprising a bulk layer is deposited using sputter deposition.

16. The method of claim 1, wherein the seed layer or the layer on the seed layer is deposited using electron cyclotron resonance plasma deposition.

17. The method of claim 1, wherein the seed layer is deposited at a lower temperature than the subsequently deposited layer.

18. The method of claim 1, further comprising:
   depositing the seed layer using atomic layer deposition, wherein the atomic layer deposition uses:
      a Zn precursor comprising diethyl zinc (DEZ), dimethyl zinc, or zinc acetate, and an oxidant comprising water, oxygen plasma, or ozone gas, and a substrate temperature between 50 to 500° C.;

annealing the seed layer at a temperature between 100 to 800° C.; and depositing the layer using the second deposition technique comprising hydrothermal deposition.

19. The method of claim 1, wherein the seed layer is doped ZnO or a dope alloy containing ZnO and the layer on the seed layer is ZnO or an alloy containing ZnO.

20. The method of claim 1, wherein the seed layer has a thickness of 50 nm or less and the layer on the seed layer has a thickness of at least 100 nm.

21. The method of claim 1, wherein the seed layer is deposited by electron cyclotron resonance (ECR) plasma deposition or electron beam deposition.

22. The method of claim 1, wherein the seed layer and the seed layer are each deposited to a thickness and with a growth rate such that:

a diode structure comprising the p-type semiconductor III-nitride material including GaN is turned on with a turn on voltage of 2.75 volts or less applied across a structure comprising the seed layer, the layer, and the diode structure, and a contact resistance of a metal contact to the layer is lower as compared to a contact resistance of the metal contact to the layer directly on the diode structure without the doped seed layer.

\* \* \* \* \*